United States Patent [19]

Tar

[11] 4,280,058

[45] Jul. 21, 1981

[54] FLAME DETECTOR

[75] Inventor: Domokos Tar, Stäfa, Switzerland

[73] Assignee: Cerberus AG, Mannedorf, Switzerland

[21] Appl. No.: 31,431

[22] Filed: Apr. 19, 1979

[30] Foreign Application Priority Data

Apr. 25, 1978 [CH] Switzerland ........................ 44678/78

[51] Int. Cl.[3] ............................................ H01L 9/00

[52] U.S. Cl. .................................... 250/554; 250/339; 340/578

[58] Field of Search ............... 250/554, 208, 209, 226, 250/339, 342; 340/577, 578, 579; 356/315

[56] References Cited

U.S. PATENT DOCUMENTS

| | | | |
|---|---|---|---|
| 3,665,440 | 5/1972 | McMenamin | 340/578 |
| 3,931,521 | 1/1976 | Cinzori | 250/339 |
| 3,967,255 | 6/1976 | Oliver et al. | 250/554 |
| 4,179,606 | 12/1979 | Nakauchi et al. | 250/339 |

*Primary Examiner*—David C. Nelms

*Attorney, Agent, or Firm*—Frishauf, Holtz, Goodman & Woodward

[57] ABSTRACT

The detector has first and second circuits which are interconnected. The first circuit senses the emission of a flame at least in the wavelength range of carbon dioxide and produces useful signals for an alarm means. The second circuit senses spurious emission produced by a thermal radiator. The first circuit is sensitive to the wavelength range of the flame below 6 μm and the second circuit is sensitive to the wavelength range of a long-wave spurious emission above 6 μm. A connecting means interconnects the first and second circuits in such a way that, while taking account of the statistical distribution of the flame emission and the spurious emission, an output signal is produced in such a way that the further transmission of the signal of the first circuit is blocked if a unidirectional output signal of the second circuit occurs at the same time, whereas it is transmitted to the alarm means if the output signal of the second circuit is absent or does not occur unidirectionally.

16 Claims, 15 Drawing Figures

FLAME DETECTOR

BACKGROUND OF THE INVENTION

The invention relates to a flame detector type of fire alarm with a circuit which, by photoelectric means and a band-pass filter, receives the emission of a flame at least in the wavelength range of carbon dioxide and at the flicker frequency range of the flame and produces useful signals therefrom for an alarm means.

It is generally known that most flammable substances such as wood, petroleum, oil and hydrocarbons or carbohydrates—in short, organic materials—emit strongly in the wavelength ranges of approximately $\lambda=2.7$ $\mu m$ (micrometers) and particularly at approximately $\lambda=4.4$ $\mu m$ when they burn. Radiation emission takes place in line spectra and band spectra, the wavelength range 2.7 $\mu m$ being characteristic for both water and carbon dioxide and 4.3 $\mu m$ being a characteristic of only carbon dioxide. The article entitled "Fire Detection using Infrared Resonance Radiation", pages 55 to 60, FIG. 6 which appeared in the journal "Report of Fire Research Institute of Japan", Ser. No. 30 of December 1969 describes the circuit of an alarm which is sensitive to flame emission and temperature. This alarm is designed for the infrared range. However, it is not false alarm-proof. If spurious infrared radiation is present, e.g. radiators or ovens, whose thermal radiation is periodically interrupted by an intervening fan or the like in a particular rhythm, an undesired alarm signal can result although there is no fire or flame.

French Patent No. 2 151 148 evaluates two wavelength ranges or wavebands for giving alarms in the case of fire. Selectivity results from the arrangement of two narrow-band optical filters which only transmit for the two wavelength ranges $\lambda=2.7$ and $\lambda=4.3$ $\mu m$. The photoelectric voltages produced by these two wavelength ranges are evaluated for giving the fire alarm. However, as tests have shown, this alarm tends to give false alarms in the case of spurious radiation sources of suitable colour temperature, so that the false alarm rate cannot be effectively reduced with this alarm.

The object of the present invention is to substantially reduce the false alarm rate of a fire alarm so that, despite the occurrence of interference sources, the alarm clearly recognises each flame or fire as such and gives the necessary alarm signal.

SUMMARY OF THE INVENTION

The invention is directed to a number of desired characteristics for evaluating emissions in the wavelength range of approximately $\lambda=4.4$ $\mu m$ for alarm-giving purposes. Normal window or lamp glass does not transmit the emission in this wavelength range. This ensures that solar radiation and normal electric light in rooms containing the alarm do not influence the giving of the alarm. Even when the fire alarm according to the invention is located in the open air, i.e. outside rooms, because there is a so-called energy gap at $\lambda=4.3$ $\mu m$ in the emission spectrum of sunlight, the sun is still not a serious interference source.

Another object of the invention is to eliminate the influence of parts of the wavelength range $\lambda>6$ $\mu m$ on the producing of an alarm, thereby eliminating the effects of heaters and ovens. Furthermore the fire alarm is to be constructed in such a way that no false alarm is produced by spurious radiation from a hot body below $\lambda=6$ $\mu m$.

An alarm is to be set off only when there is present a flame which in addition to the flicker frequency emits in the wavelength range $\lambda=4.4$ $\mu m$. This alarm is also to be given if a hot body emits its spurious radiation in the wavelength range $\lambda><6$ $\mu m$ or if the spurious radiation of the hot body is modulated only with approximately the flame flicker frequency, since a complete correspondence is very unlikely.

According to the invention the desired evaluating characteristics for eliminating spurious radiation produced by a thermal radiator are obtained by means of a second circuit, in addition to the first circuit as described above for the prior devices, with an interconnecting member between the circuits. The second circuit includes the following components:

- a first circuit having filter with a given wavelength transmission range and a photoelectric means which receives radiation above the resonance wavelength range of carbon dioxide and produces an interfering signal;
- a second circuit having band-pass filter with the same flicker frequency transmission range of the spurious radiation as the range for the flame flicker frequency in the first circuit;
- a connecting means which interconnects the first and second circuits and is so constructed that, while taking account of the statistical distribution of the flame emission and spurious radiation, an output signal is produced in such a way that the further transmission of the signal of the first circuit is blocked if a unidirectional output signal of the second circuit occurs at the same time, while its passage to the alarm means is permitted if the output signal of the second circuit is absent or is not unidirectional.

DESCRIPTION OF THE PREFERRED EMBODIMENTS

Figure 1:
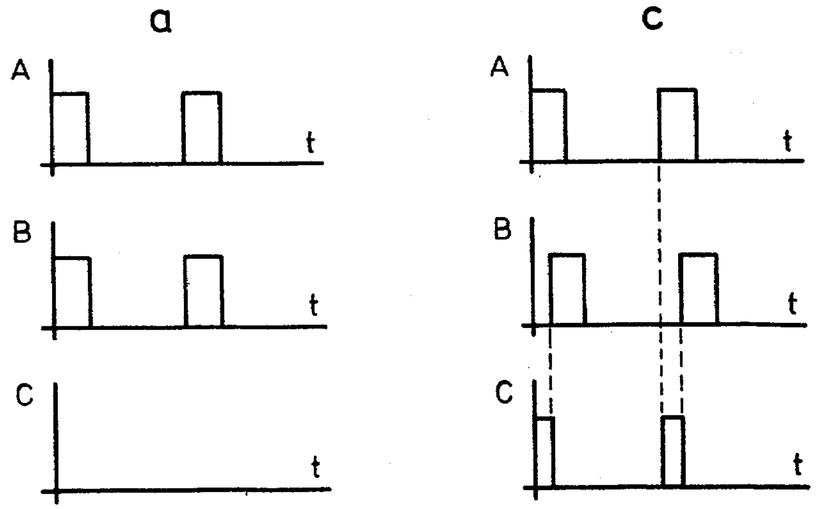
FIGS. 1a, 1b and 1c are graphs showing the operation provided by the comparator circuit shown in the preferred embodiments of the invention appearing in FIGS. 9, 10 and 11 between outputs of the first and second circuits thereof.
Figure 1:
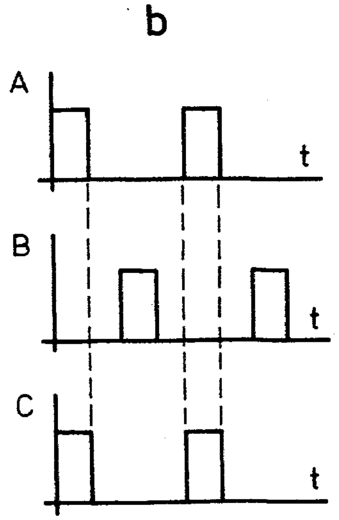

FIGS. 1*a*, 1*b* and 1*c* show pulses A, B and C plotted on time axis t. These pulses are taken to appear at the connecting points A, B, C of the preferred embodiment alarm circuits of FIGS. 9, 10 and 11. FIG. 1*a* shows the case where in the first circuit which receives the flicker of a flame or a spurious radiation a pulse is produced and appears at connecting point A of the embodiments of FIGS. 9, 10 and 11. According to FIG. 1*a*, it is assumed that a spurious signal is received in the second circuit at the same time and that a square pulse is present at point B. The connecting means, which will be described in greater detail hereinafter in conjunction with the embodiments of FIGS. 9, 10, 11, 12 and 13, is constructed in such a way that in this case no output signal is produced. This is represented in FIG. 1*a* by C=0.

FIG. 1*b* shows the case in which a flame signal is produced in the first circuit and a corresponding pulse is present at connecting point A. It is assumed that in the second circuit no spurious signal is simultaneously received and that there appear at the connecting point B of the second circuit spurious pulses which do not coincide from the time standpoint with the useful pulses at point A. A signal appears at output point C of the connecting means of the embodiments of FIGS. 9, 10 and 11 only when a useful signal is present at point A of the first circuit.

FIG. 1*c* shows at point A of the first circuit the presence of a useful signal due to a flame and in the second circuit (connecting point B) the time-delayed presence of a spurious signal. The connecting means of FIGS. 9, 10 and 11 produces an output signal only if simultaneously a useful pulse is present at connecting point A and no spurious pulse is present at connecting point B. FIG. 1*c* shows that in the case of a certain time overlap of these two pulses, the output pulse disappears at the connecting point C of the connecting means.

Figure 2:
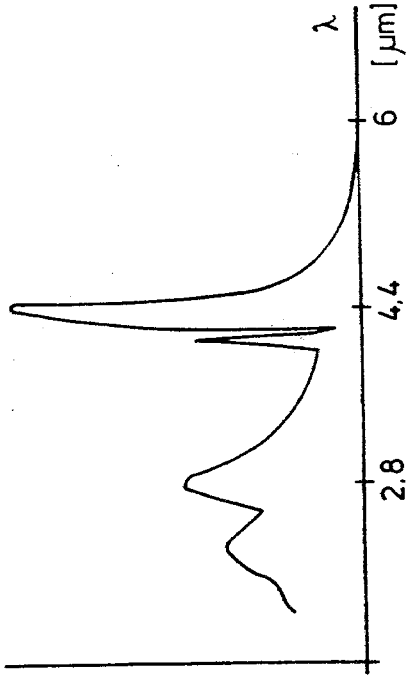
FIG. 2 is a graph showing the intensity distribution of radiation over the wavelength range of a flame.

FIG. 2 shows the intensity distribution of a typical flame spectrum. The wavelength range λ in the unit μm (micrometer) is shown on the abscissa, while the intensity in the particular wavelength range is shown on the ordinate. FIG. 2 shows clearly a pronounced intensity in the wavelength range λ=4.4 μm, which is the range for carbon dioxide. The intensity distribution has two marked maxima at 2.8 and 4.4 μm. At λ>6 μm the flame intensity can be ignored.

Figure 3:
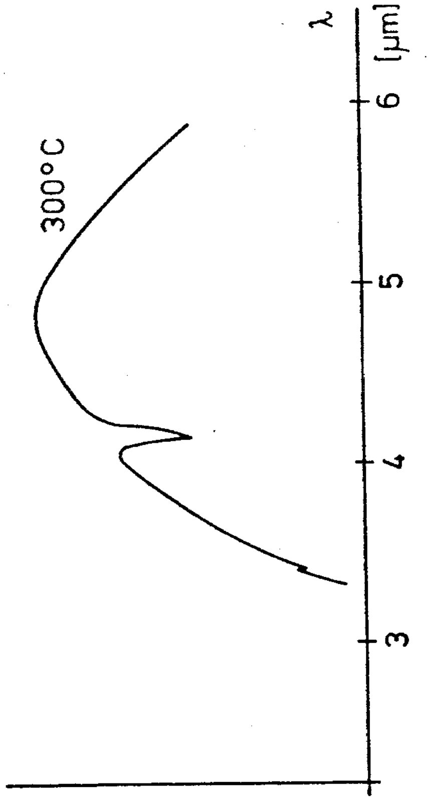
FIG. 3 is a graph showing a typical spectral intensity distribution of radiation over the wavelength range of a hot body.

FIG. 3 shows the intensity distribution of a hot body at approximately 300° C. The wavelength in μm is plotted on the abscissa and the intensity of the emission of such an interfering radiation source is plotted on the ordinate. This radiation source corresponds to a thermal radiator, e.g. heating coils or hot plates. It is assumed that the radiation is e.g. periodically interrupted by a fan. These periodic interruptions, which can be in the frequency range 4 to 15 Hz will be explained hereinafter in conjunction with the embodiments of FIGS. 9, 10, 11 and 12. Another interference source of the same type can be provided by the exhaust pipe of an internal combustion engine which, as is known, is only loosely mounted and effects movements which are approximately in the frequency range 4 to 15 Hz.

As will be described hereinafter relative to FIGS. 9, 10, 11 and 12, this frequency is in the range of the flickering flame. The types of interference or spurious sources described thus far are designated by $S_1$, as will be described in greater detail hereinafter relative to FIGS. 7*a* to *f* and the associated table. Another type of interference source can be a radiator or oven, which has a much lower radiation temperature than type $S_1$ of FIG. 3. The radiator, oven, or heating body type of spurious radiation interference source is designated by $S_2$ and radiates in the wavelength range above 5.5 μm. In the case of interference source type $S_2$, the radiation is assumed to be interrupted at a frequency in the range 4 to 15 Hz. Such an interruption can be brought about e.g. by ventilators or by the vibration of objects positioned in front of the interference sources. For reasons of completeness, it is pointed out that the spurious radiation of the embodiments of FIGS. 9 to 12 has an interfering action only if it is interrupted. This will be described in greater detail relative to these embodiments.

The interference source type $S_1/S_2$ will be described in greater detail in the table described relative to FIGS. 7 and 8.

Figure 4:
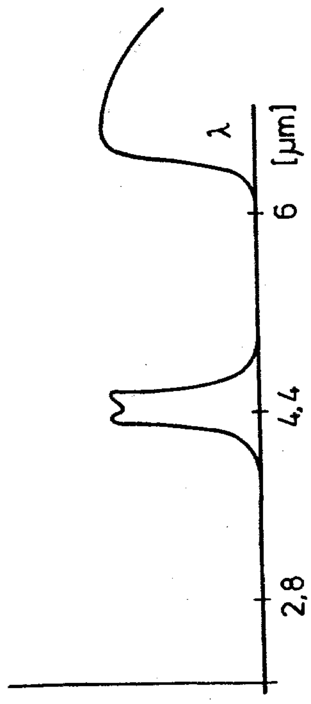
FIG. 4 is a graph of the transmission ranges of filters 1 and 9 of both circuits of a preferred embodiment of the invention.

FIG. 4 graphically shows the transmission ranges of filters 1 and 9 of the two circuits of the preferred embodiments of FIGS. 9, 10, 11 and 12. According to FIG. 4, the first circuit, which responds to the emission of flames, is provided with a filter 1 having a wavelength transmission range of about 4.4 μm. Filter 9, which is aranged in front of the second circuit of the embodiments, has a wavelength transmission range which is greater than 6 μm. In FIG. 4, the filter 9, which permits the passage of the spurious radiation, has a transmission range with an edge which rises steeply at approximately 6 μm and a front which gradually falls in the larger wavelength range.

Figure 5:
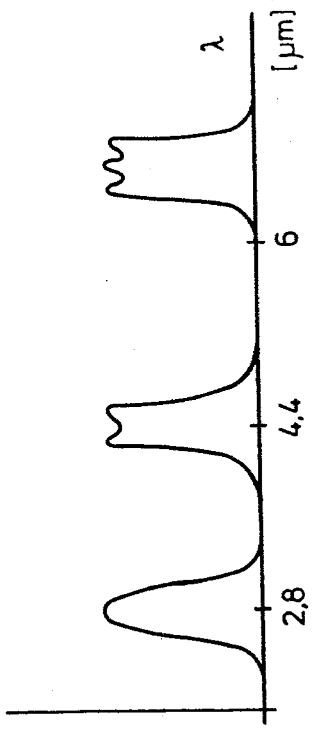
FIG. 5 is a graph of the signal transmission ranges of two useful signal circuits and one interfering signal circuit.

FIG. 5 graphically shows the transmission ranges of two useful signals in circuits of the first type and one spurious signal in a circuit of the second type. A first circuit has a filter 1 with a wavelength transmission range of approximately 2.8 μm. Another first circuit has a filter 1 with the wavelength transmission range of about 4.4 μm. A second circuit has a filter 9 with a wavelength transmission range above 6 μm. At this point it is pointed out that there can be provided three circuits to correspond to the transmission of FIG. 5. Clearly even more circuits can als be provided. The embodiments of FIGS. 9 to 12 are discussed relative to only two circuits. Filter 9 of the second circuit has, according to FIG. 5, a transmission range with steep edges on either side.

Figure 6:
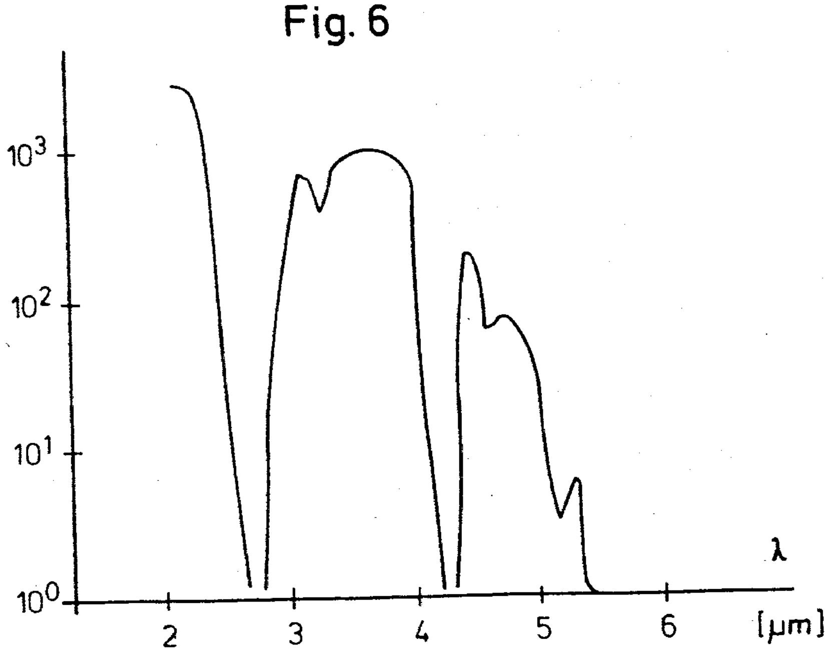
FIG. 6 is a graph of the characteristic intensity distribution of solar radiation over its emission wavelength.

FIG. 6 graphically shows the characteristic intensity distribution of normal solar radiation. The wavelength λ is plotted in μm on the abscissa and the intensity is plotted in relative units on the ordinate. The graph of FIG. 6 shows that sunlight has maxima at certain characteristic points and minima at other points. Particular reference is made to the intensity minimum at approximately 4.3 μm.

Figure 13:
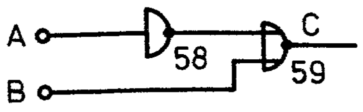
FIG. 13 is a schematic circuit diagram of another embodiment of the connecting means of FIGS. 9, 10 and 11.
Figure 8:
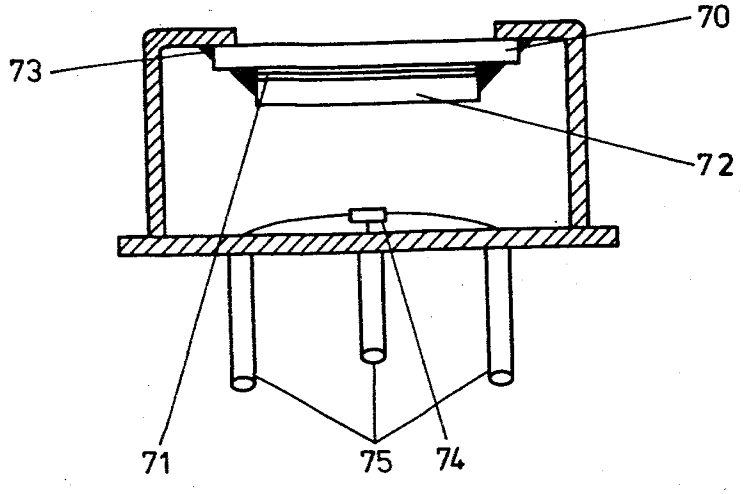
FIG. 8 is a partially sectioned front view of a filter and photoelectric means of the alarm according to a preferred embodiment.
Figure 7:
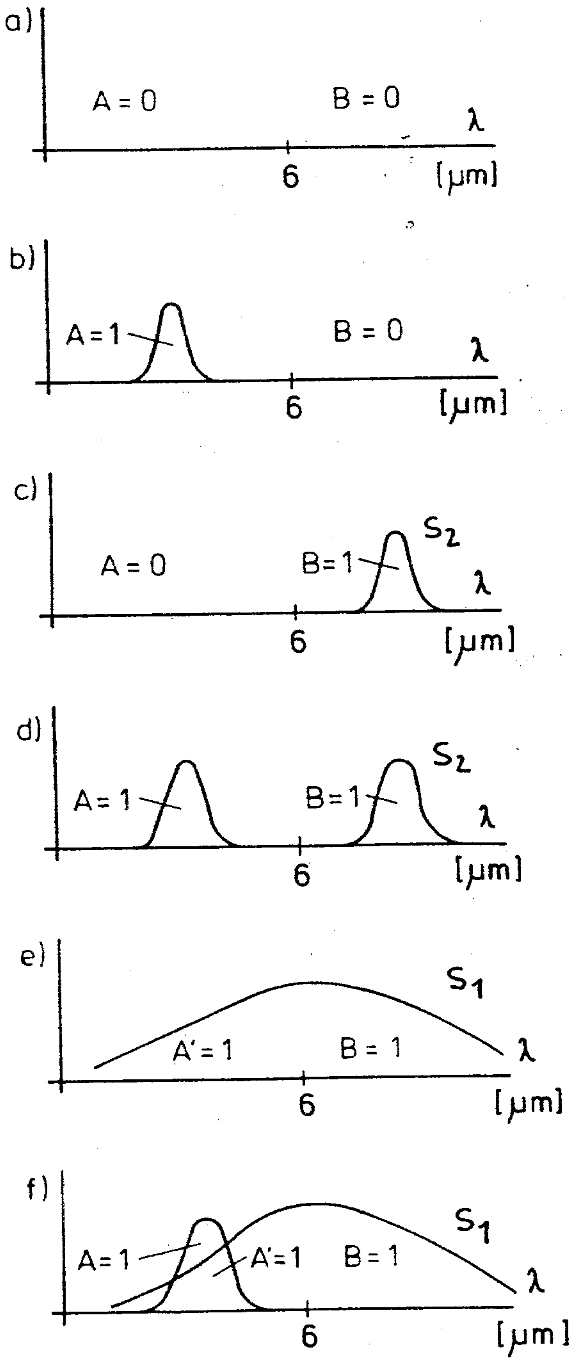
FIG. 7 shows in a series of graphs (a)–(f) various operation modes of the fire alarm according to a preferred embodiment of the invention.

FIG. 7 shows graphically the operation of the embodiments of FIGS. 9 to 12 in conjunction with the individual parts of FIGS. 8 and 13. In FIGS. 7*a, b, c, d, e, f* the wavelengths λ are plotted in μm on the abscissa and the intensities of the transmission ranges of filters 1 and 9 are plotted in relative units on the ordinate.

FIG. 7*a* shows that there is no flame and no interference. Therefore there is no pulse or voltage at points A and B in FIGS. 9, 10, 11 and 12, which means that no alarm is produced.

FIG. 7*b* indicates the presence of a flame in the wavelength range of FIGS. 4 and 5. In this case there is no interference, which means that there is a pulse or a voltage at point A of the first circuit of the embodiment of FIGS. 9 to 12. There is no voltage at point B of the second circuit, and in this case an alarm is given.

FIG. 7*c* shows the case when interference for example in the wavelength range of FIGS. 4 or 5 is present without a flame. A type $S_2$ interference source is assumed which, as indicated above, can be a radiator, thermal radiator or oven with a temperature of about 100° C. According to the case represented in FIG. 7*c*, there is no voltage at point A and there is a voltage or a pulse at point B of the circuits of FIGS. 9 to 12. In this case no alarm is given.

FIG. 7*d* shows the case where both a flame and spurious radiation of an $S_2$ interference source are present. The wavelength ranges are selected according to FIGS. 4 or 5. In this case, there is a voltage or pulse at points A and B of the circuits of FIGS. 9 to 12. If the voltage and pulse occur at these points A and B at the same time, no output signal occurs at point C via the connecting means 18, 26, 59 with inverters 17, 25, 58. Since, however, the flame and interference radiation flickers in a wide frequency range of 4 to 15 Hz, there is a statistical distribution in such a way that flame and interference radiation only occur synchronously here and there at points A and B (FIG. 7*d*) or non-synchronously (FIG. 7*b* or 7*c*). Between these situations, so-called intermediate situations occur where the voltages or pulses can partly overlap at points A and B. In this case, shown in FIG. 1*c*, a definite alarm signal is given at point C, which ensures that a flame still leads to an alarm signal even when spurious radiation is also present.

FIG. 7*e* shows the case where spurious radiation of type $S_1$ radiates over a very wide wavelength range. Such a spurious radiation source, which can be a thermal radiator (heating coils or hot plates) with a radiation temperature of about 300° C. (FIG. 3), influences not only the circuit for receiving the spurious emissions (filter 9), but also the circuit for receiving the flame of the embodiments of FIGS. 9 to 12. This means that there are synchronous voltages or pulses at points A and B, as shown in FIG. 1*a*. As a result of this synchronization between the useful voltage and the spurious voltage, no alarm signal is produced at output point C of connecting means 18, 26, 59. This is also correct, because there is no flame. To provide a better illustration of this, in FIG. 7*e* that part of the spurious emission which passes via the first circuit (useful signals) to the connecting means is designated by A'.

Another case is provided in FIG. 7*f*, where simultaneously a flame and a type $S_1$ spurious radiation source are present. The component emanating from the spurious emission and transmitted to the first circuit is designated by A'. The spurious emission component which passes via the second circuit is designated by B. As both components emanate from the same interference source, they are also synchronous, i.e. voltages and pulses simultaneously occur at points A and B, so that spurious emission components A' and B cannot produce an alarm signal at the output C of the connecting member of FIGS. 9 to 12. This is the case shown in FIG. 7*e*. The flame of FIG. 7*f* produces at point A of the embodiments of FIGS. 9 to 12 a voltage or a pulse, which can occur either simultaneously or not simultaneously with the spurious emission A' and B. Connecting means 18 produces an alarm signal at output C if a voltage or pulse corresponding to the flame is present at point A and at the same time no voltage signal of the spurious emission is present at point B. After a certain time delay, an alarm is given.

The following table serves to better illustrate the cases of FIGS. 7*a* to *f*. The figures given in the table under the heading "Observations" have the following meanings:

(1) No alarm signal, because no flame.
(2) Alarm pulse, because flame exists.
(3) Monitoring state.
(4) Without interference.
(5) With interference.
(6) Timing of A' and B coincides, giving C=0; A:-=A+A'
(7) Timing of A and B does not coincide, giving C=1; A:=A+A'.

TABLE

| | Assumption | | | | | | Result | |
|---|---|---|---|---|---|---|---|---|
| To FIG. 7 | Flame Yes/ No | A | Interference Yes/ No | B | A' | Interference Type | C | Observations |
| a | No | 0 | No | 0 | — | — | 0 | (1) (3) (4) |
| b | Yes | 1 | No | 0 | — | — | 1 | (2) (4) |
| c | No | 0 | Yes | 1 | 0 | $S_2$ | 0 | (1) (3) (5) |
| d | Yes | 1 | Yes | 1 | 0 | $S_2$ | 1 | (2) (5) |
| e | No | 0 | Yes | 1 | 1 | $S_1$ | 0 | (1) (3) (5) (6) |
| f | Yes | 1 | Yes | 1 | 1 | $S_1$ | 0:1 | (2) (5) (6) (7) |

FIG. 8 shows the constructional embodiment of the filter, including photoelectric means, as used in the embodiments of FIGS. 9 to 12. According to FIG. 8 filter 1 of the first circuit comprises a germanium or silicon layer 70, an interference filter 71 and a quartz layer 72. These different layers are plane parallel, the thickness of the germanium layer 70 being approximately 1 mm, that of the interference filter 71 approximately 1 to 50 μm, and that of quartz layer 72 approximately 0.5 mm. The diameter of these layers or filter 1 is approximately 8 to 12 mm. Interference filter 71 can comprise a plurality of layers, each layer being formed from a metallic or dielectric material. The filter comprising layers 70, 71 and 72 is placed in a so-called "TO-5" casing, which is the trade name of this particular casing which is readily available commercially.

The casing is connected to the filter by means of an adhesive 73. The sensitive element 74, optionally with a field effect transistor, is placed in the casing. This element converts the optical rays into electrical signals. These signals pass via lines 75 to the circuits of FIGS. 9 to 12. The sensitive element 74 can be a pyroelectric detector such as e.g. lithium-tantalate or lead-zirconate-titanate; and NTC thermistor; a photoconductor; or a thermopile. The filter or the photoelectric means 1, 2 of FIG. 8 is provided for the first circuit in the embodiments of FIGS. 9 to 12. Filter 9 for the second circuit of the same embodiment is constructed somewhat differently. There is no quartz layer, whereas the spatial dimensions are the same as described hereinbefore. Furthermore, the sensitive element 74 is constructed according to whether it is used in the first or the second circuit. For example, a pyroelectric detector can be used for both circuits. Furthermore, an NTC thermistor, photoconductor, and a thermopile can also be used for both circuits. If the sensitive element 74 is constructed as a photovoltaic cell or as a UV-sensitive gas-filled tube, then photoelectric means 2 can only be used in the first circuit. In this case, it is even possible to eliminate the filter comprising layers 70, 71 and 72.

Figure 9:
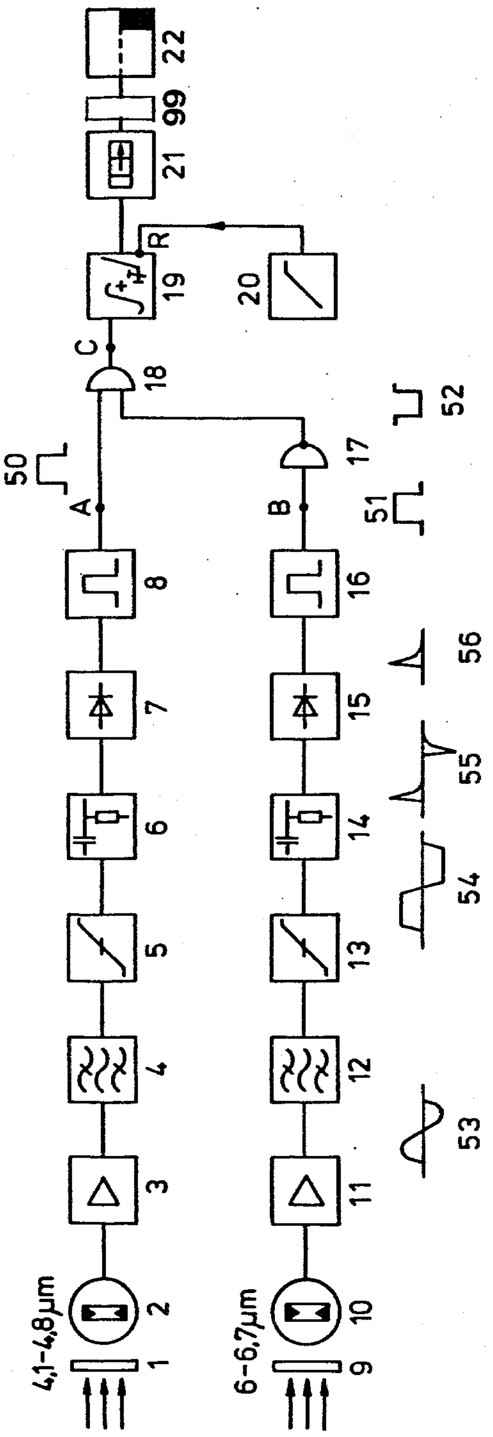
FIG. 9 is a schematic circuit diagram in block form of a first embodiment of the entire electric circuit for the fire alarm according to the invention in partial digital form accompanied by graphical representations of the signals therein.

FIG. 9 shows a first preferred embodiment of an alarm in accordance with the invention. It comprises two circuits. The first circuit is equipped with a filter 1 and a photoelectric means 2 which transmits the wavelength range of $\lambda=4.1$ to 4.8 $\mu$m. This wavelength range is such that a flame emission passes through filter 1 to the photoelectric means (sensitive element 74 of FIG. 8) and then releases corresponding useful electrical signals, which are amplified in the following amplifier 3. These amplified signals are designated as 53 at the bottom of FIG. 9. The following band-pass filter 4 has a transmission range for the flame flicker frequency, which is between 4 and 15 Hz. This is followed by an amplitude limiter 5 which clips the amplitudes of the amplified signal 53 and produces trapezoidal signals 54. The latter pass to a differentiating element 6 which produces a voltage pulse 55 for each rising edge of signals 54. These pulses are rectified in the following rectifier 7 in such a way that only the differentiated voltage pulses 56 of one polarity reach the following monostable multivibrator 8, which produces pulses 50 of constant amplitude and width. In this manner the amplitude and width are made independent of the intensity of the flame. The second circuit, whose filter 9 has a wavelength transmission range of $\lambda=6$ to 6.7 $\mu$m, is constructed in the same way as the first circuit described above. Amplifier 11 amplifies the electrical signals of photoelectric means 10. The band-pass filter 12 has a transmission range for the flicker frequency of the interference source which is also in the range 4–15 Hz. The amplitude limiter 13, differentiating element 14, rectifier 15 and monostable multivibrator 16 function in the same way as described in conjunction with the first circuit. Monostable multivibrator 16 produces pulses 51 of constant amplitude and width. The amplitude and width of these pulses are not dependent on the intensity of the spurious emission. It is now assumed that only a flame emission is present in FIG. 9, in which case the first circuit produces the pulses 50 at point A. The second circuit produces no pulse at point B (state=0). The following inverter circuit 17 therefore produces the state 1, which reaches the connecting means. This is constructed as an AND gate, so that the latter produces a pulse at its output C. This pulse is transmitted to the following integrator 19, which by means of timing element 20 is reset after a given time of e.g. 5 to 15 seconds. When the AND gate 18 is constructed digitally, the integrator 19 contains a circuit which counts the output pulses having a given minimum width. Only when a number of output pulses have entered the counter and when a given threshold value previously set in the counter is exceeded, does integrator 19 give an alarm pulse to the following circuit parts. The alarm pulse can only be produced by the integrator if the threshold value of the counter is exceeded prior to the resetting by the time switch 20. A delay element 21 is provided to ensure than an alarm signal is not given too quickly, e.g. within two seconds. The delay element delays by a few seconds the further transmission of the alarm signal and passes it to the alarm exchange 22 only if the alarm signal from integrator 19 persists during this period. By means of FIG. 9, the situation shown in FIG. 7*b* has been discussed. The situation of FIG. 7*f* will now be briefly described. Since a flame is present, monostable multivibrator 8 produces pulses 50 at point A. Due to the presence of a type $S_1$ interference source, the monostable multivibrator 16 also produces at point B pulses 51. Furthermore, the type $S_1$ interference source has such a large emission range that the spurious emission influences the first circuit, and monostable multivibrator 8 produces another kind of pulses 50 at point A. The pulses 50 emanating from interference emission (see component A' of FIG. 7*f*) are still at point B, synchronously with pulses 51. Due to inverter 17, AND gate 18 is blocked when the synchronous pulses 50, 51 are present. Since the flicker frequencies of the flame and the spurious emission are statistically distributed relative to one another, time differences occur between flame pulses 50 and spurious pulses 51 at points A and B, so that the AND gate 18 is largely opened for the further transmission of useful pulses 50 to the following integrator 19. This ensures that an alarm is given when a flame and interference are simultaneously present. All the examples of FIG. 7 and the following table can be performed with the embodiment of FIG. 9. The individual electronic circuit components of the two circuits of FIG. 9 have not been described in detail because they are well known from the literature. Reference is made in this regard to the following literature:

"Linear Applications Handbook" Volumes 1 and 2, 1977, National Semiconductor Corporation.

"Applications of Operational Amplifiers", Publishers, McGraw-Hill Company, New York, 1976.

"Sourcebook of Electronic Circuits", Publishers, McGraw-Hill Company, New York, 1968.

U.S. Pat. Nos. 3,762,674, 3,940,353, and 3,940,753.

Figure 10:
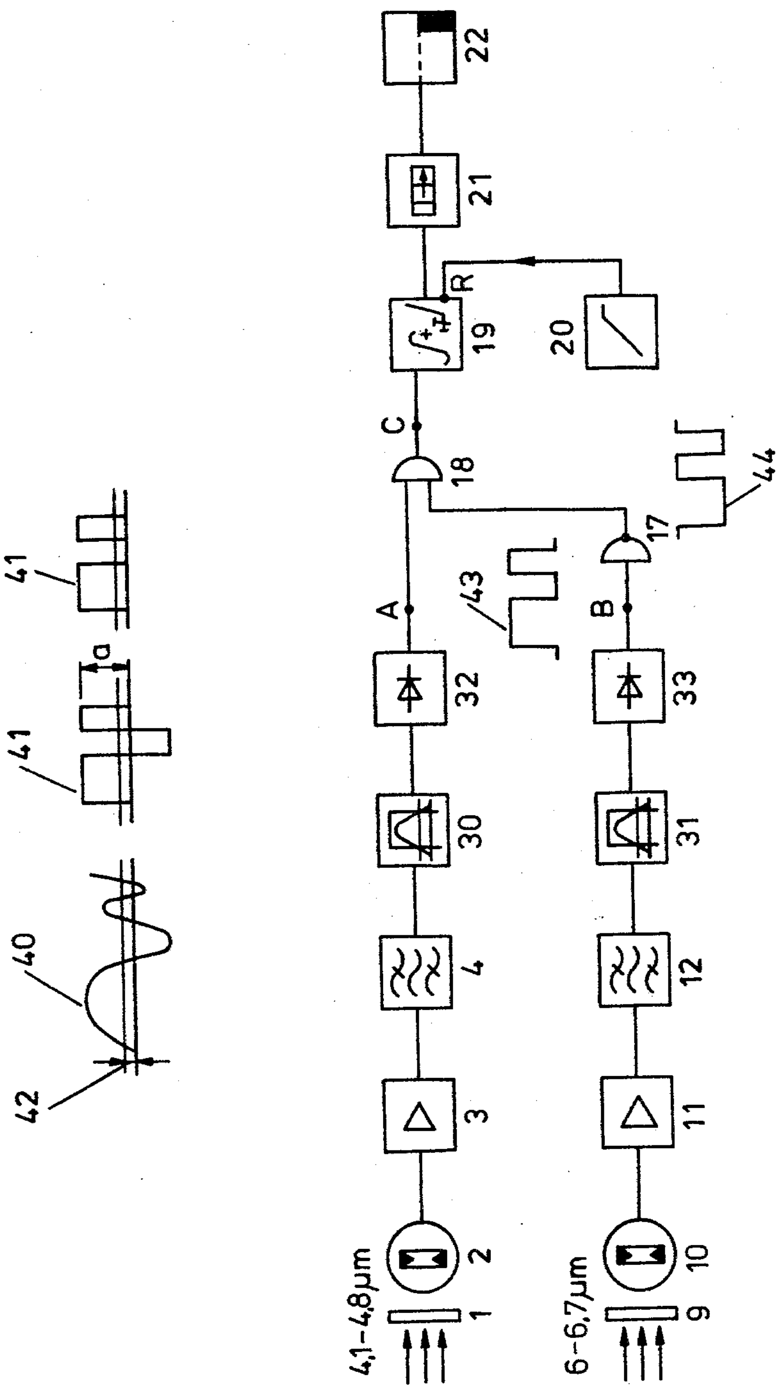
FIG. 10 is a schematic circuit diagram in block form of a second embodiment of a fire alarm circuit according to the invention in partial digital form accompanied by a corresponding graph of the signals therein.

The embodiment of FIG. 10 is constructed substantially like the embodiment of FIG. 9. The only difference is that the pulses appearing at points A and B no longer have a width which is independent of the flame flicker frequency and the spurious emission. In the embodiment of FIG. 10, the pulses 41 have a width which is dependent on the cycles of the oscillations 40. The cycle of said oscillations 40 represents the flame flicker frequency or the spurious emission. The width or duration of pulses 41 and 43 is determined by the threshold 42 of comparator 30 or 31. The two circuits are equipped with the same electronic components. Filters 1 and 9 have the same transmission ranges as in the embodiment of FIG. 9. The photoelectric means 2 and 10, amplifiers 3 and 11 and band-pass filters 4 and 12 are constructed in the same way as previously described above. Comparators 30 and 31 are arranged behind band-pass filters 4. The output signals from these comparators, shown at the top of FIG. 10, reach rectifiers 32 and 33. The operation of comparators 30 and 31 will now be described. The value of the output signal is:

$$a \text{ if } S_A(t) > \epsilon$$

$$-a \text{ if } S_A(t) < \epsilon$$

in which:

$S_A$=amplitude of the input signal at both comparators 30 and 31.

$\epsilon$=threshold value.

The mathematical expression indicates that the same input signal $S_A$ can be present for the first circuit (comparator 30) and the second circuit (comparator 31), and that the output pulses of both comparators have a constant amplitude +a or −a. The threshold $\epsilon$ is provided so that noise in the two circuits can be better suppressed. The function of elements 19, 20, 21, 22 and AND gate 18 is the same as in the embodiment of FIG. 9. Here again, integrator 19 has a counter with a predetermined threshold value. The counter is reset after a given time of approximately 5 to 15 seconds. If the counter has exceeded its threshold value prior to this resetting, a signal is transmitted to the delay element 21. The counter in the integrator 19 can be replaced by a capacitor which is successively charged by the pulses which are allowed to pass through the AND gate 18 when pulses 43 are not present in point B of the second circuit. For reasons of completeness, it is pointed out that the inverter 17 supplies the inverted pulses 44 to the second input of the AND gate 18 and consequently blocks or opens the AND gate for the further transmission of pulses 41 from the first circuit.

Figure 11:
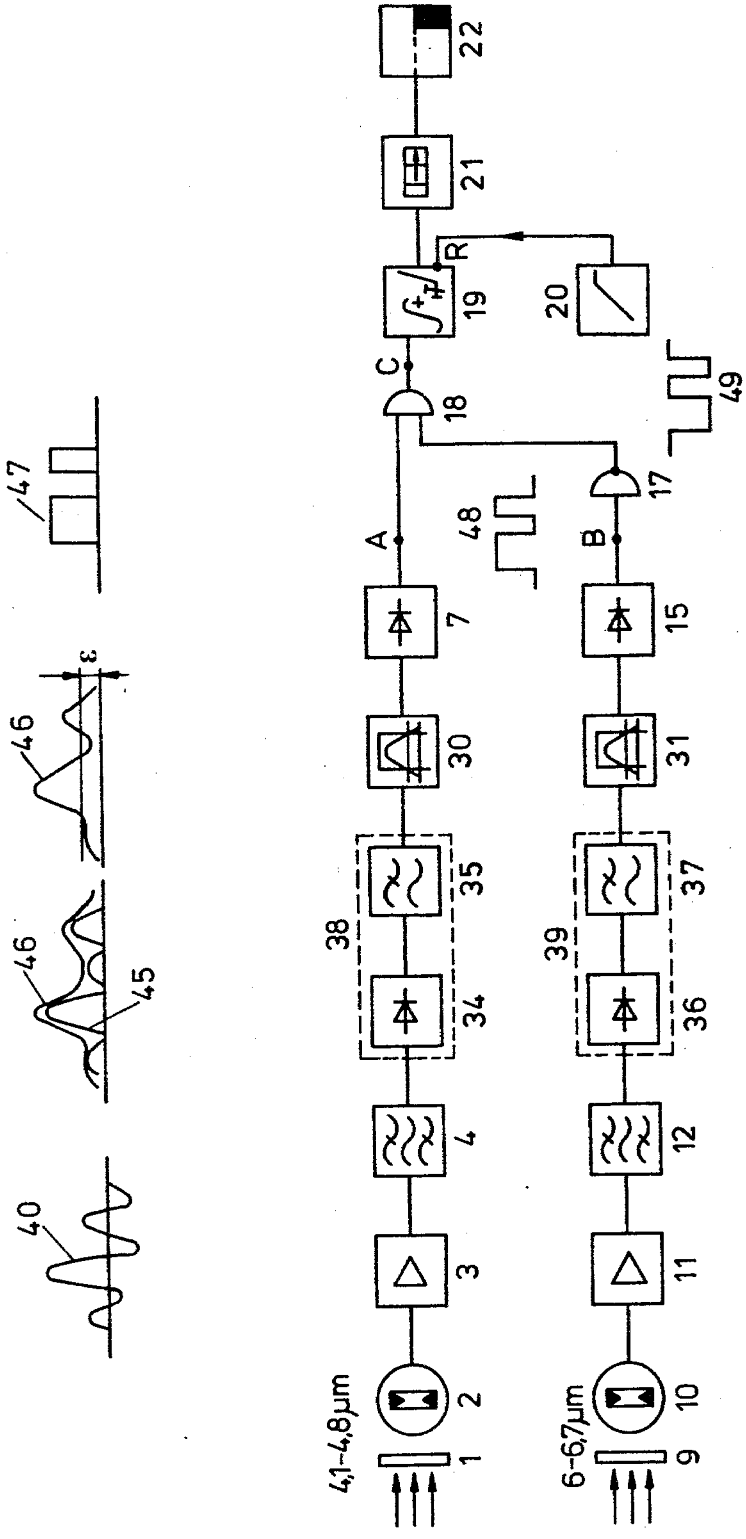
FIG. 11 is a schematic circuit diagram in block form of a third embodiment of the fire alarm circuit according to the invention.

The embodiment of FIG. 11 shows two circuits with similar electronic components to those described hereinbefore. However, in this case demodulators 38 or 39 are arranged behind band-pass filters 4 or 12. Each of these demodulators comprises a rectifier 34 or 36 and a low-pass filter 35 or 37. Comparators 30, 31 and rectifiers 7, 15 are again arranged behind demodulators 38, 39. Through the arrangement of the demodulators 38, 39 the modulation envelope curve 46 of the rectified signal half-waves 45 can be formed from the flicker frequency 40 of the flame and the spurious emission. Demodulators 38, 39 are not described in detail here, because they are generally known from the literature. Reference can be made to the already quoted literature sources.

Comparators 30 and 31 take account of the predetermined threshold value $\epsilon$ in the same way as described in conjunction with FIG. 10. If a flame is present in accordance with FIG. 7, the first circuit produces corresponding envelope curves 46. At point A, pulses 47 occur and their width is dependent on the modulation envelope curve 46 which envelops the oscillations 45 of the flame flicker frequency. The amplitude of pulses 47 is constant. If there is a spurious emission source in accordance with the different cases of FIG. 7, the second circuit also produces modulation envelope curves 46. Modulator 31 takes account of threshold value $\epsilon$. At point B, pulses 48 are produced with a width which is dependent on the modulation envelope curve 46 enveloping the oscillations 45 of the flicker frequency of the spurious emission source. The subsequently arranged inverter 17 produces the inverted pulses 49. AND gate 18 functions in the same way as described in conjunction with the previous embodiments. Integrator 19 can contain either a counter or a capacitor. The formation of the threshold value and the time-based resetting by the time switch 20 have already been described several times.

Figure 12:
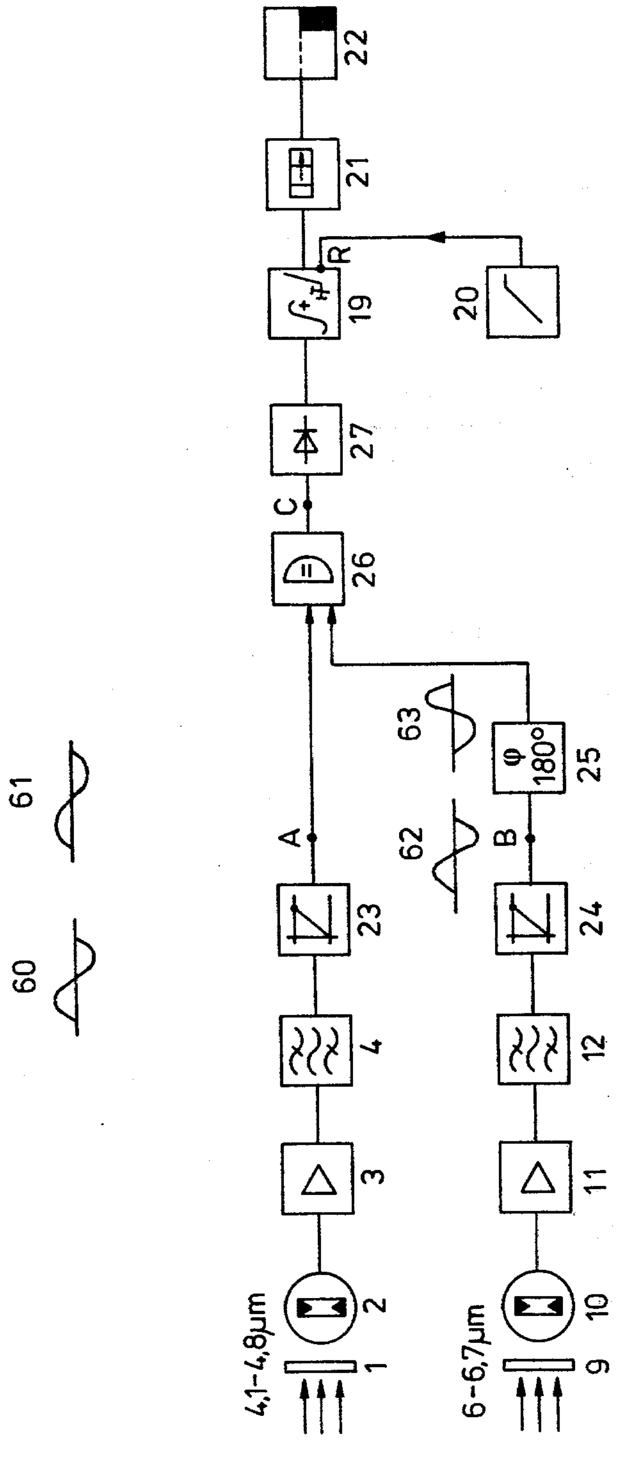
FIG. 12 is a schematic circuit diagram in block form of a fourth embodiment of a fire alarm circuit in accordance with the invention which is in part identical to that of FIG. 11, accompanied by a corresponding graph of the signals therein.

The fourth embodiment of FIG. 12 once again comprises the two circuits and a connecting means 26, which in this case is constructed as a phase comparator. Filters 1 and 9 have the same transmission range as in the earlier embodiments. Once again photoelectric means 2 and 10 are equivalently constructed. Amplifiers 3 and 11 amplify the signals. Filters 4 and 12 permit the passage of the flicker frequency only in the range 4 to 15 Hz. These oscillations in the flicker frequency range of the flame and the spurious emission are indicated at the top of FIG. 12 by the reference numeral 60. These oscillations reach the threshold value detectors 23 and 24. If there is a flame, an oscillation 61 is present at point A of the first circuit. If a spurious emission source is present, an oscillation 62 occurs at point B of the second circuit. In the following phase inverter 25, the oscillation 62 is converted into an oscillation 63. The oscillation signal 61 of point A now passes through phase comparator 26 to rectifier 27 and integrator 19 if the signal 63 is unidirectional with respect to signal 61. In other words, signal 62 must not be unidirectional with respect to signal 61. The term "unidirectional" or "not unidirectional" should be understood to mean that in the first case equal signs, and in the second case unequal signs, are present at the two inputs of phase comparator 26. The operation leading to the alarm via integrator 19 and delay element 21 is the same as described hereinbefore.

It is finally pointed out that the embodiments of FIGS. 9, 10, 11 and 12 can have numerous circuits of the first type for useful signals of the flame emission and only one circuit of the second type for the spurious signals of the interference source. This means that each of the useful signal circuits functions in a different wavelength range, e.g. chosen from the ranges of 4 to 4.8 μm, 3 to 3.8 μm, 1.8 to 2.8 μm, 0.7 to 1.2 μm, and 0.1 to 0.5 μm, while the spurious signal circuit functions in the wavelength range above 6 μm, as is represented e.g. in FIG. 5.

FIG. 13 shows a further embodiment of the interconnecting member for the useful signal and spurious signal circuits, the connecting means being in the form of a NOR gate. This is a NOR gate 59, whose one input contains an inverter 58. The operation of the connecting means 58, 59 is the same as that of means 17, 18 of the embodiments of FIGS. 9, 10 and 11, so that no further description will be provided here.

I claim:

1. A flame detector of the type having a first circuit for sensing at least the flame-resonant radiation having a wavelength of 4.4 μm which is characteristic of carbon dioxide and in response thereto generating a first electrical signal for activating an alarm means, the first circuit comprising a photoelectric means for producing a first circuit signal and a band-pass filter which passes the first circuit signal only at the flicker frequency range of the flame, a second circuit for sensing the presence of spurious radiation of the same flicker frequency range as that sensed by the first circuit, said second circuit sensing only radiation having a wavelength substantially greater than the characteristic wavelength of resonant radiation of carbon dioxide at 4.4 μm, comprising second photoelectric means generating a second electrical signal, and further comprising a second band-pass filter having the same pass-band as the band-pass filter of the first circuit and connecting means interconnecting said first and second circuits and comprising comparator means for comparing said first and said second electrical signals and blocking activation of said alarm means by said first electrical signal whenever the radiation sensed by said second circuit corresponds in frequency and is synchronous to the radiation sensed by that first circuit.

2. The detector according to claim 1, wherein said first circuit comprises in series:

a first circuit radiation filter (1) which selectively transmits infra-red radiation of a flame, including flame-resonant radiation with a wavelength of 4.4 μm, the photoelectric means (2) positioned to receive the radiation transmitted by the radiation filter and producing the first circuit electrical signals, an amplifier (3) for amplifying the first circuit signals from the photoelectric means (2), the band-pass filter (4), said band-pass filter having a pass band corresponding to the flicker frequency of the radiating flame, and a signal converter (5, 6, 7, 8) which differentiates and converts the amplified first circuits signals passed by the band-pass filter (4) to square-wave signals (50) of equal width, wherein said second circuit comprises, in series:

a second circuit radiation filter (9) which selectively transmits spurious source radiation with a wavelength greater than 6 μm, the second photoelectric means (10) positioned to receive the radiation transmitted by the second circuit radiation filter and in response thereto producing the second circuit electrical signals, an amplifier (11) for amplifying the second circuit signals from the photoelectric means (10)

the second band-pass filter (12), said second bandpass filter having a pass band similar to that of the first circuit bandpass filter, and a signal converter (13, 14, 15, 16) which differentiates and converts the amplified second circuit signals (51) passed by the second circuit band-pass filter to square-wave signals of equal amplitude and width, and, wherein said connecting means (18) is an AND gate with a first input connected to receive the first circuit square-wave signals (50) and a second input which comprises a signal inverter (17) and is connected to receive the inverted second circuit square-wave signals (52).

3. The detector according to claim 1, wherein said first circuit comprises in series:

a first circuit radiation filter (1) which selectively transmits infra-red radiation of a flame, including flame-resonant radiation with a wavelength of 4.4 μm, the photoelectric means (2) positioned to receive the radiation transmitted by the radiation filter and producing the first circuit electrical signals, an amplifier (3) for amplifying the first circuit signals from the photoelectric means, the band-pass filter (4), said band-pass filter having a pass band corresponding to the flicker frequency of the radiating flame, and a signal converter (30, 32) which generates square-wave impulses (41) having a constant amplitude and a width which is dependent on the period of each oscillation (40) of the first circuit signals representing the flicker frequency, wherein said second circuit comprises, in series:

a second circuit radiation filter (9) which selectively transmits spurious source radiation with a wavelength greater than 6 μm, the second photoelectric means (10) positioned to receive the radiation transmitted by the second circuit radiation filter and in response thereto producing the second circuit electrical signals, an amplifier (11) for amplifying the second circuit signals from the photoelectric means (10), the second band-pass filter (12), said second band-pass filter having a pass band similar to that of the first circuit band-pass filter, and a signal converter (31, 33) which generates second circuit squarewave impulses (43) of constant amplitude and with a width which is dependent on the period of each individual oscillation (40) of the second circuit signals representing the flicker frequency; and wherein said connecting means (18) is an AND gate with a first input connected to receive the first circuit square-wave signals (41) and a second input which comprises a signal inverter (17) and is connected to receive the inverted second circuit square-wave signals (44).

4. The detector according to claim 1, wherein said first circuit comprises, in series:

a first circuit radiation filter (1) which selectively transmits infra-red radiation of a flame, including flame-resonant radiation with a wavelength of 4.4 μm, photoelectric means (2) positioned to receive the radiation transmitted by the radiation filter and producing the first circuit electrical signals, an amplifier (3) for amplifying the first circuit signals from the photoelectric means (2), the band-pass filter (4), said band pass filter having a pass band corresponding to the flicker frequency of the radiating flame, and a signal converter (38, 30, 7) which generates first circuit square-wave impulses (47) with a constant amplitude and a width dependent on the oscillations (45) of an envelope curve (46) of the flicker frequency of the flame, wherein said second circuit comprises, in series:

a second circuit radiation filter (9) which selectively transmits spurious source radiation with a wavelength greater than 6 μm, the second photoelectric means (10), positioned to receive the radiation transmitted by the second circuit radiation filter and in response thereto producing the/second circuit electrical signals, an amplifier (11) for amplifying the second circuit signals from the photoelectric means (10), the second band-pass filter (12), said second band-pass filter having a pass band similar to that of the first circuit band-pass filter, and a signal converter (39, 31, 15) which generates second circuit square-wave impulses (48) with a constant amplitude and a width dependent on the oscillations (45) of an envelope curve (46) of the flicker frequency of the flame; and wherein said connecting means (18) is an AND gate with a first input connected to receive the first circuit square-wave signals (47) and a second input which comprises a signal inverter (17) and is connected to receive the inverted second circuit square-wave signals (49).

5. The detector according to claim 1, wherein said first circuit comprises, in series:

a first circuit radiation filter (1) which selectively transmits infra-red radiation of a flame, including flame-resonant radiation with a wavelength of 4.4 μm the photoelectric means (2) positioned to receive the radiation transmitted by the radiation filter and producing the first circuit electrical signals, an amplifier (3) for amplifying the first circuit signals from the photoelectric means (2), the band-pass filter (4), said band-pass filter having a pass band corresponding to the flicker frequency of the radiating flame, and a threshold value switch (23) which receives from the band-pass filter (4) the electrical oscillations (60) representative of the flicker frequency of the flame and generates a first circuit output signal (61) when a particular threshold value is exceeded, wherein said second circuit comprises, in series:

a second circuit radiation filter (9) which selectively transmits spurious source radiation with a wavelength greater than 6 μm, the second photoelectric means (10) positioned to receive the radiation transmitted by the second circuit radiation filter and in response thereto producing the second circuit electrical signals, an amplifier (11) for amplifying the second circuit signals from the photoelectric means (10), the second base-pass filter (12), said second band-pass filter having a pass band similar to that of the first circuit band-pass filter, and a threshold value switch (24) which receives from the second circuit band-pass filter (12) the electrical oscillations (60) representative of the flicker frequency of the flame and generates a second circuit output signal (62) when a particular threshold value is exceeded, wherein said connecting means (26) is a phase comparator which receives at a first input the first circuit output signal (61) of the threshold value switch and receives at a second input, which has an inverter (25), the inverted second circuit output signal (63) of the other threshold value switch (24).

6. The detector according to claim 1, wherein the connecting means (18) is a NOR circuit (59) having an inverter (58) in its first input.

7. The detector according to claim 1, wherein there is connected to the connecting means (18) an integrator (19) which adds the output signals of the connecting means and which has a resetting circuit (20) for resetting the added content of the integrator (19) to prevent the activation of the alarm means by spurious undesired individual impulses.

8. The detector according to claim 7, wherein the integrator (19) includes a counter which counts the output signals of the connecting means (18) and wherein the resetting circuit (20) includes means which reset the counter periodically or in the event that there are no output signals within a certain time period.

9. The flame detector according to claim 8, wherein the integrator (19) includes a capacitor which adds the output signals of the connecting means (18) and wherein the resetting circuit (20) includes means which discharge the capacitor with a greater time constant than that with which it is charged by the output signals of the connecting means (18).

10. The flame detector according to claim 7, or 8 or 9, wherein there is connected to the integrator (19) a threshold value switch which generates an output signal for an alarm means (22) when the sum of the signals of the integrator (19) exceeds a certain threshold value.

11. The flame detector according to claim 10, comprising a delay line (21) between the threshold value switch and the alarm means (22), the delay line (21) delaying in time the output signal of the threshold value switch to the alarm means (22).

12. The flame detector according to claim 1, comprising at least two circuits of the first circuit type (1, 2, 3, 4, 5, 6, 7, 8; 30, 32; 38, 30, 7; 23) for generating electrical signals corresponding to at least one of the flame radiation wavelength ranges 4 to 4.8 μm, 3 to 3.8 μm, 1.8 to 2.8 μm, 0.7 to 1.2 μm, 0.1 to 0.5 μm and one circuit of the second type (9, 10, 11 12, 13, 14, 15, 16; 31, 33; 39; 24, 25) for generating electrical signals corresponding to the spurious radiation wavelength greater than 6 μm.

13. The flame detector according to claim 1, wherein the filter of the first circuit comprises at least are of a quartz layer (72); a semiconductor layer (70); a broadband interference filter (71) which passes radiation in the wavelength range of 4.0 to 4.8 μm.

14. The flame detector according to claim 13, wherein the filter is a semiconductor layer (70) including a layer of germanium.

15. The flame detector according to claim 1, wherein the photoelectric means of the first circuit comprises a substance chosen from the group consisting of lithium tantalate ($LiTaO_4$), lead selenide (PbSe), lead-jirconate-titanate.

16. The flame detector according to claim 1, wherein the photoelectric means of the second circuit comprises a substance chosen from the group consisting of lithium tantalate ($LiTaO_4$), lead-zirconate-titanate.

* * * * *